(12) United States Patent
Tortorelli et al.

(10) Patent No.: US 9,275,730 B2
(45) Date of Patent: Mar. 1, 2016

(54) APPARATUSES AND METHODS OF READING MEMORY CELLS BASED ON RESPONSE TO A TEST PULSE

(71) Applicant: Micron Technology, Inc., Boise, ID (US)

(72) Inventors: Innocenzo Tortorelli, Cernusco sul Naviglio (IT); Fabio Pellizzer, Cornate d'Adda (IT)

(73) Assignee: MICRON TECHNOLOGY, INC., Boise, ID (US)

(*) Notice: Subject to any disclaimer, the term of this patent is extended or adjusted under 35 U.S.C. 154(b) by 0 days.

(21) Appl. No.: 14/251,002

(22) Filed: Apr. 11, 2014

(65) Prior Publication Data

US 2015/0294716 A1 Oct. 15, 2015

(51) Int. Cl.
*G11C 11/00* (2006.01)
*G11C 13/00* (2006.01)

(52) U.S. Cl.
CPC .......... *G11C 13/004* (2013.01); *G11C 13/0004* (2013.01); *G11C 2013/0045* (2013.01)

(58) Field of Classification Search
USPC .................................................. 365/163, 201
See application file for complete search history.

(56) References Cited

U.S. PATENT DOCUMENTS

| 2008/0121859 A1* | 5/2008 | Campbell ......................... 257/2 |
| 2009/0052236 A1 | 2/2009 | Bae et al. |
| 2011/0038195 A1* | 2/2011 | Hamilton et al. ............. 365/148 |
| 2013/0051123 A1* | 2/2013 | Lee et al. ...................... 365/148 |
| 2013/0155767 A1* | 6/2013 | Brand et al. .................. 365/148 |

* cited by examiner

*Primary Examiner* — Hoai V Ho
(74) *Attorney, Agent, or Firm* — Knobbe, Martens, Olson & Bear LLP (57) ABSTRACT

The disclosed technology generally relates to memory apparatuses and methods of operating the same, and more particularly to memory arrays and methods of reading memory cells in a memory array, such as a cross point memory array. In one aspect, the method comprises providing a memory array comprising a memory cell in one of a plurality of states. The method additionally comprises determining whether a threshold voltage (Vth) of the memory cell has a value within a predetermined read voltage window. A test pulse is applied to the memory cell if it is determined that the threshold voltage has a value within the predetermined read voltage window. The state of the memory cell may be determined based on a response of the memory cell to the test pulse, wherein the state corresponds to the one of the pluralities of states of the memory cell prior to receiving the test pulse.

23 Claims, 8 Drawing Sheets

APPARATUSES AND METHODS OF READING MEMORY CELLS BASED ON RESPONSE TO A TEST PULSE

FIELD

This disclosure generally relates to memory apparatuses and methods of operating the same, and more particularly to memory arrays and methods of reading memory cells in the memory arrays, such as in cross point memory arrays.

BACKGROUND

Many memory apparatuses have a controller configured to cause a memory access operation, such as a read operation, to determine whether a memory cell in a memory array has one state (e.g., a programmed state) or another state (e.g., an erased state). In some memory apparatuses, such determination of the state of the memory cell can be based on the detected value of a threshold voltage and/or a read current associated with the memory cell. For example, a threshold voltage of a memory cell exceeding a certain voltage may be associated with the memory cell being in a programmed state, whereas a threshold voltage less than a certain voltage may be associated with the memory cell being in an erased state. It will be appreciated that while it may be desirable to have a large threshold voltage difference or a large current difference (also referred to as a window) between programmed and erased states of the memory cells, statistical distribution of the memory cells may limit or even eliminate the voltage and/or current window. Thus, there is a need for apparatuses and methods for effective reading of memory cells in a memory array, where the threshold voltage and/or threshold current window is limited or eliminated.

DETAILED DESCRIPTION

In some memory apparatuses, the determination of whether a memory cell in the memory array is in one state (e.g., a programmed state) or another state (e.g., an erased state) can be made based on the detected value of a threshold voltage and/or a read current associated with the memory cell. For example, a threshold voltage of a memory cell exceeding a certain voltage may be associated with the memory cell being in a programmed state, whereas a threshold voltage less than a certain voltage may be associated with the memory cell being in an erased state. In a memory array having a plurality of memory cells, a voltage window whose minimum and maximum values demarcate two states (e.g., programmed and erased memory states) is sometimes referred to as a read voltage window (RVW) associated with the two states. Under normal operation, it may be desirable to have the memory cells not have a threshold voltage between these two voltages, to allow the memory cells within the memory array to be clearly distinguished as being in one or the other of the two states.

Generally, from a design point of view as well as a reliability point of view, it may be desirable to have a relatively large RVW. A large RVW can be obtained in a number of ways, including, for example, programming and erasing the memory cells with sufficient program and erase pulses such that the resulting window is large. A large read window can also be achieved by various means that result in a smaller statistical spread within the states. However, it will be appreciated that under some circumstances it may not be desirable or technically feasible to have sufficiently large read window due to statistical distribution, drift of states over time, material limitations or choice of device architecture, among other technological or design reasons, such that a memory array has a relatively small, zero, or even a negative RVW. In the following, apparatuses and methods for enabling effective reading of memory cells in a memory array, such as a cross point array, where the RVW is limited, zero or negative.

While some embodiments are described herein with respect to cross-point memory arrays as an example, accessing devices as described herein may also have application to other types of memory arrays and to outside the memory array context, e.g., switches, antifuses, etc. Similarly, while embodiments are described with respect to memory cells incorporating Ovonic Threshold Switch (OTS) and/or memory storage elements that incorporate chalcogenide materials, the principles and advantages of the techniques and structures taught herein may be useful for other materials that demonstrate thresholding behavior.

Figure 1:
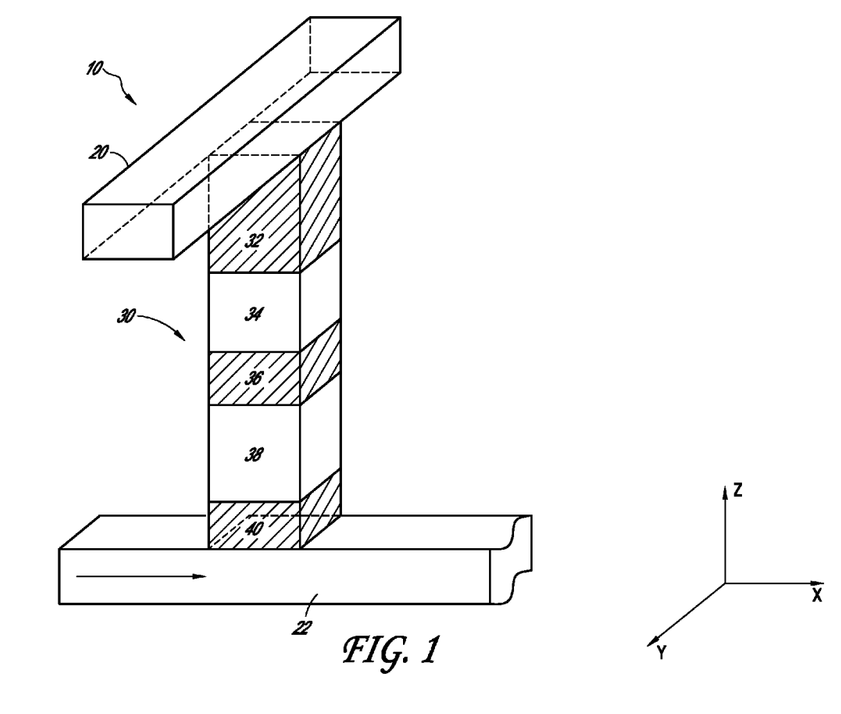
FIG. 1 is a schematic three-dimensional isometric view depicting a memory cell incorporating chalcogenide materials according to some embodiments.

FIG. 1 depicts a memory cell 10 in a memory array according to some embodiments. The memory cell 10 in FIG. 1 is a phase change memory cell arranged in a stack configuration between a column line 20 extending in a y direction and a row line 22 extending in an x direction. While only one memory cell 10 is depicted in FIG. 1 for clarity, it will be appreciated that there can be a plurality of memory cells 10, e.g., in a cross-point memory array, having a plurality of column lines 20 and a plurality of row lines 22. The memory cell 10 includes a first electrode 32 under the column line 20, a storage node 34 under the first electrode 32, a middle electrode 36 under the storage node 34, a selector node 38 under the middle electrode 36, and a second electrode 40 under the selector node 38 and a row line 22 under the selector node 38. Other embodiments of a stack configuration are possible. For example, the positions of the selector node 38 and the storage node 34 within a stack configuration may be interchanged with one another. In other examples, the storage node 34 incorporates selector functionality and the selector node 38 may be omitted. In other examples, any one of the first, second, and middle electrodes may be interchanged with one another. In yet other examples, any one of the first electrode 32, the middle electrode 36, the second electrode 40, and the selector node 38 may be omitted.

In some embodiments, one or both of the selector node 38 and the storage node 34 can comprise chalcogenide materials.

When both the selector node 38 and the storage node 34 comprise chalcogenide materials, the storage node 34 can comprise a chalcogenide material that can undergo a phase change to one of a plurality of states that are stable at room temperature. On the other hand, the selector node 38 can comprise a chalcogenide material that does not undergo a similar stable phase change.

In one embodiment, the storage node 34 includes a phase change material that includes chalcogenide compositions such as an alloy including at least two of the elements within the indium(In)-antimony(Sb)-tellurium(Te) (IST) alloy system, e.g., $In_2Sb_2Te_5$, $In_1Sb_2Te_4$, $In_1Sb_4Te_7$, etc., an alloy including at least two of the elements within the germanium (Ge)-antimony(Sb)-tellurium(Te) (GST) alloy system, e.g., $Ge_8Sb_5Te_8$, $Ge_2Sb_2Te_5$, $Ge_1Sb_2Te_4$, $Ge_1Sb_4Te_7$, $Ge_4Sb_4Te_7$, etc., among other chalcogenide alloy systems. The hyphenated chemical composition notation, as used herein, indicates the elements included in a particular mixture or compound, and is intended to represent all stoichiometries involving the indicated elements. Other chalcogenide alloy systems that can be used in phase change storage nodes include Ge—Te, In—Se, Sb—Te, Ga—Sb, In—Sb, As—Te, Al—Te, In—Ge—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, and Ge—Te—Sn—Pt, for example.

When included in the memory cell 10, the selector node 38 may be a two-terminal selector electrically coupled to the storage node 34 through the middle electrode 36 on one side and electrically connected to the row line 22 through the second electrode 40 on the other side. In one embodiment, the selector node 38 comprises a chalcogenide material and can be referred to as an Ovonic Threshold Switch (OTS). An OTS may include a chalcogenide composition including any one of the chalcogenide alloy systems described above for the storage node. In addition, the selector node may further comprise an element to suppress crystallization, such as arsenic (As). When added, an element such as As suppresses crystallization by inhibiting any non-transitory nucleation and/or growth of the alloy. Accordingly, the selector node 38 may be configured to switch to a conductive state when a potential exceeding a threshold voltage is applied across the selector node 38. Examples of OTS materials include Te—As—Ge—Si, Ge—Te—Pb, Ge—Se—Te, Al—As—Te, Se—As—Ge—Si, Se—As—Ge—C, Se—Te—Ge—Si, Ge—Sb—Te—Se, Ge—Bi—Te—Se, Ge—As—Sb—Se, Ge—As—Bi—Te, and Ge—As—Bi—Se, among others.

The memory cell 10 may have a resistance state that may be a relatively high resistance state (HRS), also known as the RESET state, which can correspond to a phase change material including a substantial amorphous region. Similarly, any one of the memory cells may have a resistance state that may be a relatively low resistance state (LRS), also known as the SET state, which can correspond to a phase change material that is substantially crystalline. The RESET and SET states can have a resistance ratio between, for example, two and 1 million.

As used herein, a write access operation, which for a phase change memory can also be referred to as a program operation or a RESET operation, changes the resistance state of the memory cell from a relatively low resistance state to a relatively high resistance state. Similarly, an erase operation, which for a phase change memory can also be referred to as a SET operation, changes the resistance state of the memory cell from a relatively high resistance state to a relatively low resistance state. However, the terms "write" and "erase" as they relate to RESET and SET operations may be used interchangeably to mean the opposite. For example, an erase operation may be referred to as a RESET operation, and a program or write operation may be referred to as a SET operation.

In addition, while SET and RESET states may herein be used to refer to states corresponding to a memory cell in general, when the memory cell includes a storage node and a selector node where the selector node does not undergo a stable change in resistance, it will be understood that the distinction between SET and RESET states of the memory cell originate from the resistance difference of the storage node.

In some embodiments, a SET operation can induce an amorphous-to-crystalline transition in the storage node of the memory cell as a result of a SET current $I_{SET}$ flowing through the thresholded memory cell (or through an adjacent heater) that is sufficient to induce the amorphous-to-crystalline transition. The resulting change in the resistance of the chalcogenide material can be that from a RESET state to a SET state. On the other hand, a RESET operation can induce a crystalline-to-amorphous transition in the storage node as a result of a RESET current $I_{RESET}$ flowing through the thresholded memory cell that is sufficient to induce the crystalline-to-amorphous transition. The resulting change in the resistance of the chalcogenide material can be from an SET state to a RESET state.

In some embodiments, SET and RESET states may correspond to the "1" state and a "0" state, respectively, in a single bit-per-cell memory system. However, the states "1" and "0" as they relate to high and low resistance states may be used interchangeably to mean the opposite. The SET state may correspond to a storage node having a relatively higher degree of crystallinity and the RESET state may correspond to a storage node having a relatively lower degree of crystallinity in some embodiments.

In other embodiments, there may be more than two resistance states. For example, a memory cell can have four states, e.g., first, second, third, and fourth resistance states that may correspond to the "00," "01," "10", and "11" states in a two bits-per-cell memory system. In these embodiments, the first through fourth states may be associated with increasing degrees of crystallinity.

Yet other embodiments are possible, where first through eighth resistance states represent the states in a three-bits-per cell memory system, and where first through sixteenth resistance states represent the states in a four-bits-per cell memory system.

In the following, embodiments may be described using two states (e.g., SET and RESET) of the memory cells that may overlap in threshold voltage distributions. However, it will be understood that the concepts described herein are generally applicable to multi-level memory cells, where the memory cells can be placed in any suitable number of states, such as four, eight, sixteen, etc., where the threshold voltage distributions of the memory cells in any two different states may overlap. For example, in one aspect, a SET state and a RESET state can represent two of more than two states that indicate relative degrees of crystallinity.

Figure 2:
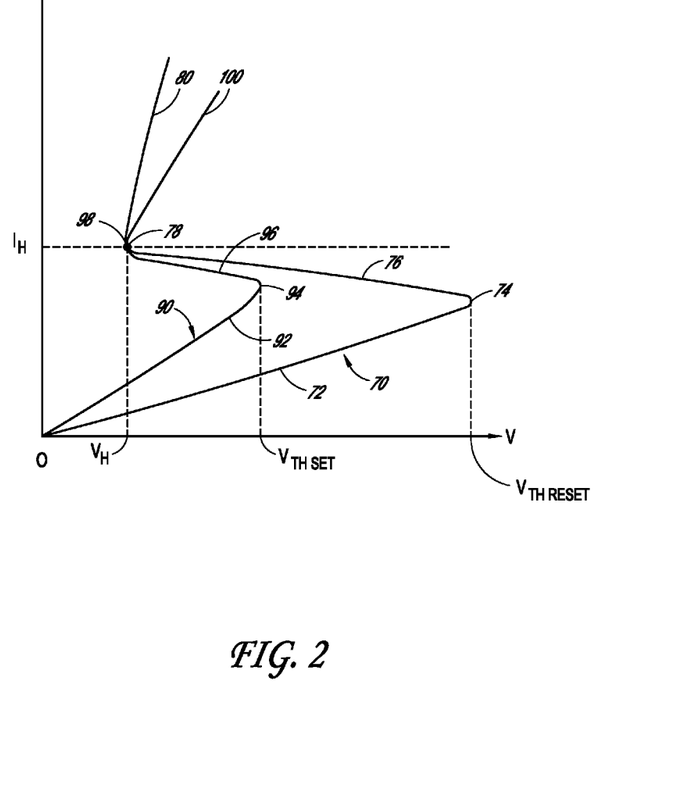
FIG. 2 is a schematic current versus voltage relationship of a memory cell incorporating phase change material according to some embodiments.

FIG. 2 schematically illustrates current-voltage (I-V) curves of a memory cell having a chalcogenide material undergoing SET and RESET transitions according to some embodiments. The x-axis represents voltage applied across a phase change memory cell and the y-axis represents current measured in log scale across the phase change memory cell. A SET transition I-V curve 70 represents a phase change memory cell undergoing a transition from a RESET state to a SET state, while a RESET transition I-V curve 90 represents a phase change memory cell undergoing a transition from a SET state to a RESET state.

The SET transition I-V curve 70 includes a RESET state subthreshold region 72 characterized by a relatively slow-varying current versus voltage, followed by a SET transition threshold "nose" region 74 at about the threshold voltage of the RESET state ($V_{TH\ RESET}$), around which point the SET transition I-V curve 70 undergoes a reversal of slope, followed by a SET transition snap back region 76 characterized by a rapid reduction in the voltage across the memory cell, followed by a SET transition hold region 78 around a hold voltage $V_H$, followed by a SET cell access region 80, in which either a stable current or voltage can be measured.

Still referring to FIG. 2, the RESET transition I-V curve 90 includes a SET state subthreshold region 92 characterized by a relatively slow-varying current versus voltage, followed by a RESET transition threshold "nose" region 94 at about the threshold voltage of the SET state ($V_{TH\ SET}$), around which point the RESET transition I-V curve 90 undergoes a reversal of slope, followed by a RESET transition snap back region 96 characterized by a rapid reduction in the voltage across the memory cell, followed by a RESET transition hold region 98 around a hold voltage $V_H$, followed by a RESET cell access region 100, in which either a stable current or voltage can be measured. It will be appreciated that while the RESET cell access region 100 is depicted as being substantially different from the SET cell access region 80 in FIG. 2, in other examples, RESET and SET cell access regions 100 and 80 can substantially overlap one another, for example when the voltage drop across the memory cell is relatively similar between the memory cell undergoing SET and RESET transitions.

It will be appreciated that both SET and RESET transition I-V curves 70 and 90 have snap back regions 76 and 96, respectively, characterized by rapid reduction in voltages across the memory cell. A snap-back effect can be accompanied by a discharge current that flows through the memory cell. The amount of the current discharged can depend on the capacitance and the resistance of at least one of the column line or the row line connected to the memory cell undergoing the snap-back effect. Depending on the values of these capacitances and the resistances, the amount of current and/or the duration of the snap back event can be sufficient to induce a partial or a full phase change in a phase change memory under some circumstances.

It will be appreciated that in embodiments where the memory cell has storage and selector nodes in series, as in memory cell 10 of FIG. 1, the voltage across the memory cell 10 at a given current can be divided between the selector node 38 and the storage node 34. The voltage across the selector node 38 can be unaffected by whether the storage node 34 is in a SET state or a RESET state, and therefore most of the difference in voltages across the memory cell between SET and RESET states can be attributed to the difference in resistance of the storage node 34 between SET and RESET states. Therefore, this difference between $V_{TH\ RESET}$ and $V_{TH\ SET}$ can be used to distinguish SET and RESET states. For example, when a voltage between $V_{TH\ RESET}$ and $V_{TH\ SET}$ is applied across the memory cell, a cell in the RESET state may not threshold, whereas a cell in the SET state may threshold.

Figure 3A:
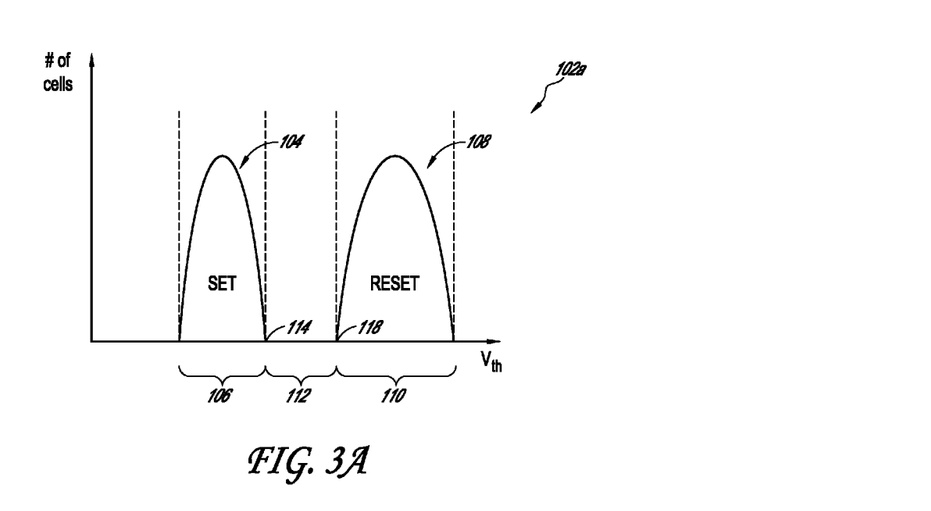
FIGS. 3A and 3B are schematic representations of threshold voltage distributions of phase change memory cells according to some embodiments.
Figure 3B:
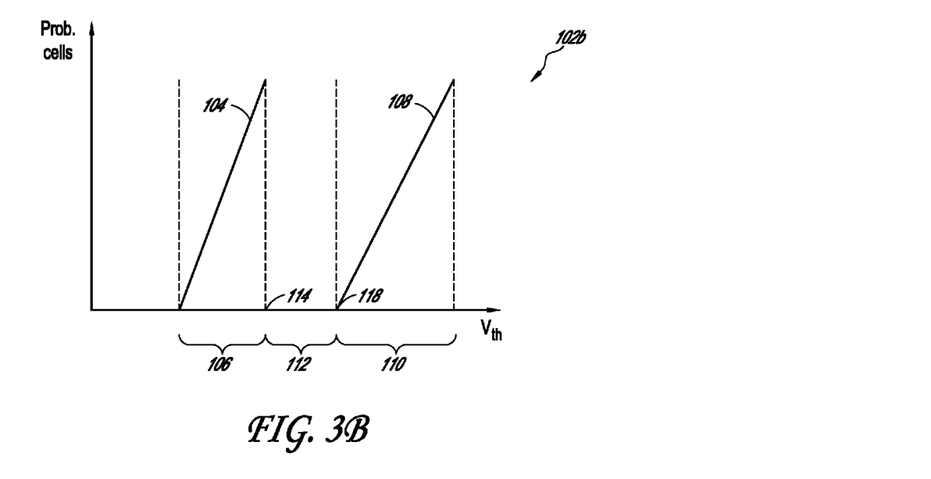

Because a memory array has a plurality of memory cells, the memory array can have a distribution of SET and RESET threshold voltages $V_{TH\ SET}$ and $V_{TH\ RESET}$. FIGS. 3A and 3B are schematic representations of threshold voltage distributions of $V_{TH\ SET}$ and $V_{TH\ RESET}$, according to some embodiments. The x-axis of the threshold distribution plots 102a and 102b of FIGS. 3A and 3B, respectively, represents the threshold voltage of memory cells within the memory array. The y-axis of the threshold distribution plot 102a of FIG. 3A represents the number of cells having a given threshold voltage in a log scale, while the y-axis of the threshold cumulative distribution plot 102b of FIG. 3B represents the number of cells having a threshold voltage lower than a given value in a probability scale. While the threshold distribution plots 102a and 102b of FIGS. 3A and 3B may correspond to memory cell distributions having normal or Gaussian distributions, it will be understood that such representations are for illustration purposes only, and the memory cell distributions can take any distributions, including Poisson, log-normal and Lorentzian distributions, to name a few.

The threshold distribution plots 102a and 102b include a SET $V_{TH}$ distributions curve 104 and a RESET $V_{TH}$ distribution curve 108 corresponding to respective distributions of $V_{TH\ SET}$ of memory cells in the SET states and $V_{TH\ RESET}$ of memory cells in the RESET states. The SET $V_{TH}$ distribution and RESET $V_{TH}$ distribution curves 104 and 108 have a SET $V_{TH}$ range 106 and a RESET $V_{TH}$ range 110, respectively, which can be ranges of the respective threshold voltages defined by $+/-n\cdot\sigma$ of the memory cells within the respective distributions, where $\sigma$ is a standard deviation. Depending on the error tolerance of the memory array, n can have a value between, for example, about 3 and about 5, for instance about 4. In addition, the SET $V_{TH}$ distribution curve 104 has a maximum threshold voltage (SET $V_{TH\ MAX}$) 114 within the distribution and the RESET $V_{TH}$ distribution curve 108 has a minimum threshold voltage (RESET $V_{TH\ MIN}$) 118 within the distribution. As used in some memory technologies, and as used herein, the difference between RESET $V_{TH\ MIN}$ 118 and SET $V_{TH\ MAX}$ 114 (i.e., RESET $V_{TH\ MIN}$ minus SET $V_{TH\ MAX}$) is referred to a read voltage window (RVW) 112. In some embodiments, the memory cells may be designed to have nonoverlapping SET $V_{TH}$ and RESET $V_{TH}$ distribution curves 104 and 108 such that the memory array can be programmed/erased to have a positive RVW 112 exceeding zero. A positive RVW 112 can be desirable for a number of reasons, including providing sufficient voltage margin for distinguishing cells in the SET states from RESET states. In other embodiments, the memory cell may be designed to have a negative RVW 112 where the SET $V_{TH}$ and RESET $V_{TH}$ distribution curves 104 and 108 have an overlapping region. Such may be the case, for example, when a particular choice of memory cell materials and/or a configuration may offer other benefits such as speed, energy, retention, cyclability, etc. In yet other embodiments, a RVW 112 having a zero value is also possible.

Figure 4:
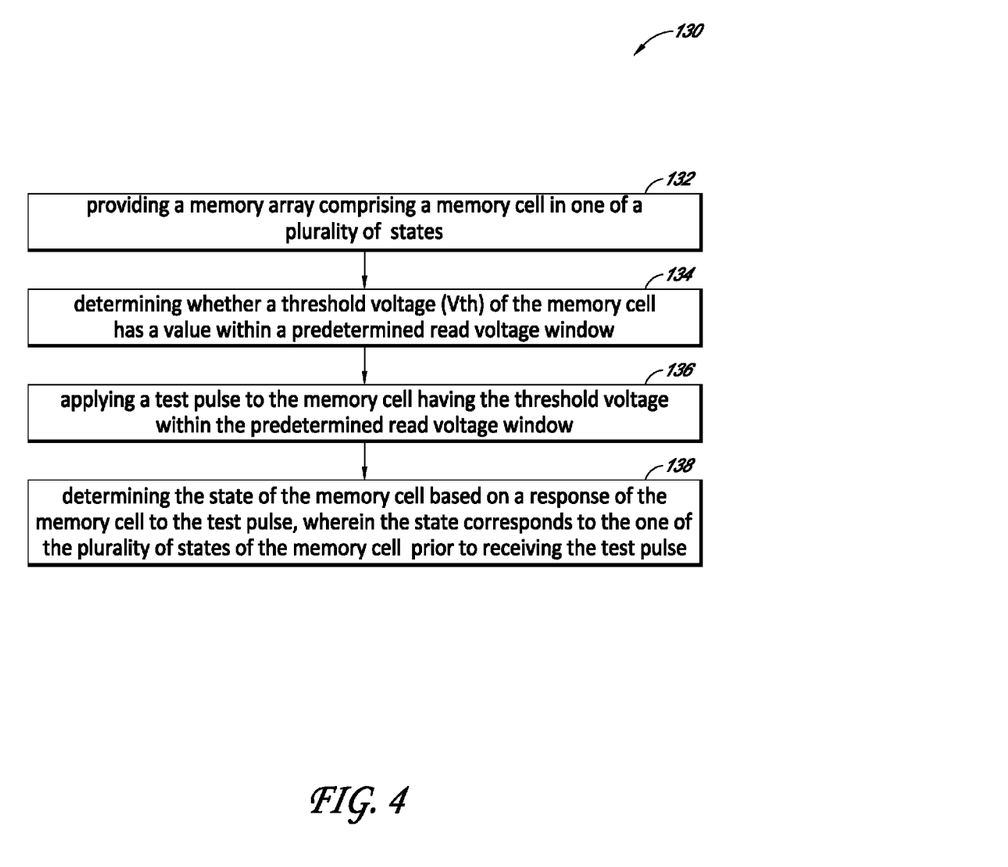
FIG. 4 is a flow chart illustrating a method of reading a memory cell according to some embodiments.

FIG. 4 is a flow chart illustrating a method 130 of reading a memory cell having overlapping distributions, according to some embodiments. The method comprises providing 132 a memory array, e.g., a cross point array, comprising a memory cell, e.g., a phase change memory cell, in one of a plurality of states, such as a first state, e.g., a SET state or a second state, e.g., a RESET state. The method additionally comprises determining 134 whether a threshold voltage (Vth) of the memory cell has a value within a predetermined read voltage window. The method additionally comprises applying 136 a test pulse to the memory cell upon determining that the threshold voltage has a value within the predetermined read voltage window. The method further comprises determining 138 the state of the memory cell based on a response of the memory cell to the test pulse, wherein the determined state corresponds to the state of the memory cell prior to receiving the test pulse. The method 130 may be applied to an apparatus comprising a memory array including a memory cell in one of a plurality of states, and a memory controller. The memory controller can be configured to determine whether a threshold voltage (Vth) of the memory cell has a value within a predetermined read voltage window, cause a test pulse to be applied to the memory cell upon determining that the threshold voltage has a value within the predetermined read voltage window, and determine the state of the memory cell prior to receiving the test pulse based on a response of the memory cell to the test pulse.

In the following, in FIGS. 5A and 5B, a method according to some embodiments similar to the method 130 of FIG. 4 is described in detail. The method shown in FIGS. 5a and 5B comprises determining the state a memory cell within an overlap region of the threshold voltage distributions based on a response of the memory cell to a test pulse, where the response includes the state of the cell being altered from a RESET state to a SET state (also referred to as bit-alteration). In FIGS. 6A and 6B, another method according to some other embodiments similar to the method 130 of FIG. 4 is described in detail. The method shown in FIGS. 6A and 6B comprises determining the state a memory cell within an overlap region of the threshold voltage distributions based on a response of the memory cell to a test pulse, where the response includes the state of the cell being altered from a SET state to a RESET state (also referred to as a bit-alteration).

It will be appreciated that the method 130 of FIG. 4 as well as the methods described in the following can be used synergistically with an error correction code (ECC). In some embodiments, upon determining 134 that the threshold voltage (Vth) of the memory cell has a value within a predetermined read voltage window, an ECC can be applied, as understood in the art, instead of proceeding to apply 136 a test pulse. In other embodiments, an ECC can be applied in addition to proceeding to apply 136 the test pulse.

Figure 5A:
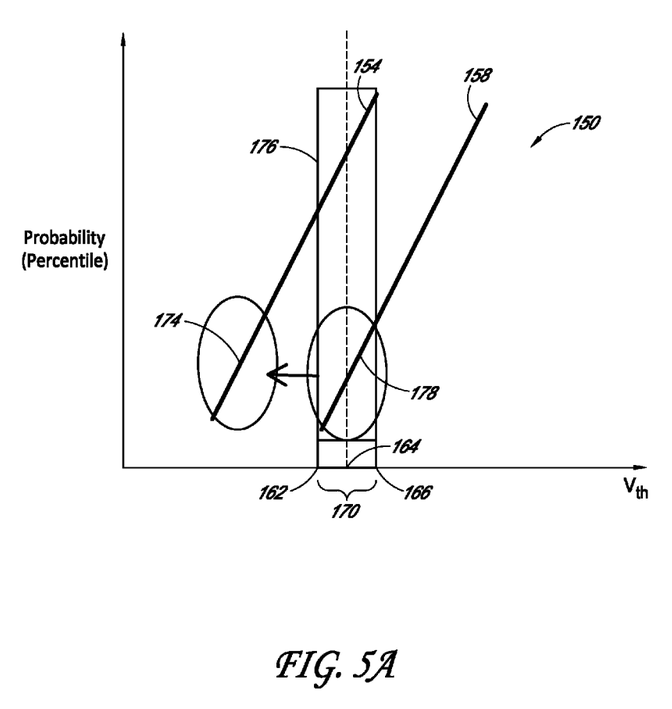
FIG. 5A is a schematic representation of threshold voltage distributions of phase memory cells according to some embodiments.
Figure 6A:
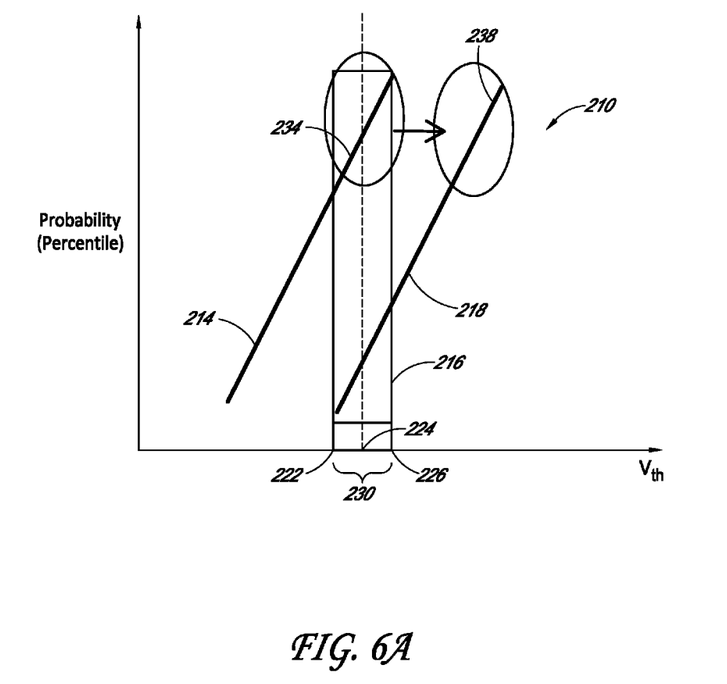
FIG. 6A is a schematic representation of threshold voltage distributions of phase memory cells according to some embodiments.
Figure 6B:
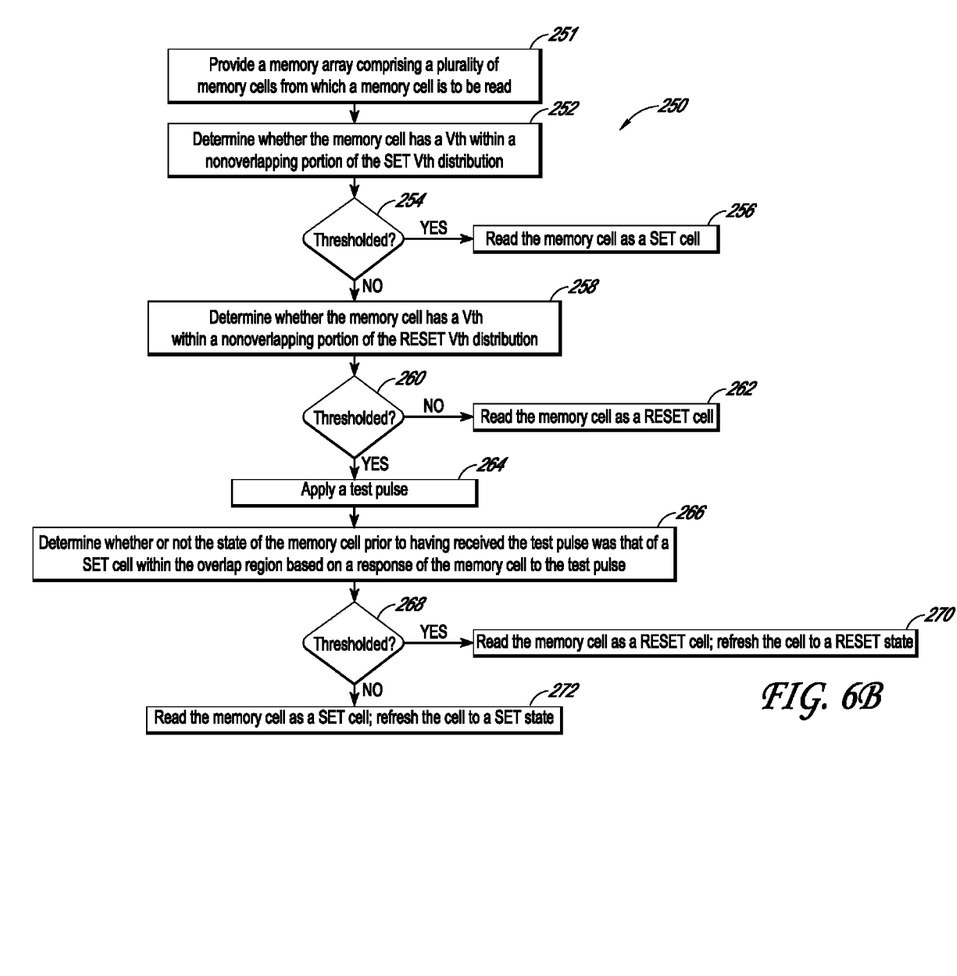
FIG. 6B is a flow chart depicting a method of reading a memory cell according to some embodiment.

FIG. 5A is a schematic threshold distribution probability plot 150 illustrating a method of reading a memory cell having a negative read voltage window (i.e., overlapping SET $V_{TH}$ and RESET $V_{TH}$ distributions), according to some embodiments. The x-axis and the y-axis of the distribution probability plot 150 represent, respectively, the threshold voltage of memory cells in the memory array and the probability (in percentile) of memory cells in a memory array having a threshold voltage lower than the voltage reported on the x-axis.

The cumulative distribution probability plot 150 includes a SET $V_{TH}$ distributions curve 154 and a RESET $V_{TH}$ distribution curve 158 corresponding to respective distributions $V_{TH\ SET}$ of memory cells in SET states and distributions of $V_{TH\ RESET}$ of memory cells in RESET states. The SET $V_{TH}$ distribution curve 154 has a maximum threshold voltage (SET $V_{TH\ MAX}$) 166 within the distribution and the RESET $V_{TH}$ distribution curve 158 has a minimum threshold voltage (RESET $V_{TH\ MIN}$) 162 within the distribution. Unlike the probability plot of FIG. 3B, because of an overlap region 176 between the SET $V_{TH}$ distributions curve 154 and the RESET $V_{TH}$ distribution curve 158, the probability plot 150 of FIG. 5A has a RVW 170, defined as the difference of the RESET $V_{TH\ MIN}$ 162 and the SET $V_{TH\ MAX}$ 166 as defined herein, that is negative. As a result, in FIG. 5A, two memory cells in different resistance states (i.e., SET and RESET states) having threshold voltages within the negative RVW 170 may not be distinguishable by using a simple threshold read scheme, where a read voltage $V_{READ}$ 164 between the RESET $V_{TH\ MIN}$ 162 and the SET $V_{TH\ MAX}$ 166 is applied to a memory cell within the read voltage window 170, and a determination of whether the cell is in a SET state or a RESET state is made based on whether the memory cell thresholds or not at the read voltage $V_{READ}$ 164.

According to some embodiments, the two memory cells within the negative RVW 170 as in FIG. 5A can be distinguished through a method including applying a test pulse to a memory cell having a threshold voltage within the overlap region 176. According to the method, a test pulse can be applied to a memory cell to determine, or after determining, that the threshold voltage has a value within the negative RVW 170. In some embodiments, applying the test pulse comprises thresholding the memory cell such that a snap-back discharge current flows through the memory cell. In some embodiments, applying the test pulse comprises applying one of a READ pulse or a SET pulse, either of which may include a snap back event. In some embodiments, if the memory cell prior to receiving the test pulse is in a RESET state within the negative RVW 170, and applying the test pulse results in altering of the state to a SET state, it can be inferred that the state of the memory cell that has been altered was in a RESET state to begin with. For example, when a RESET cell within a low RESET Vth (RESET $V_{TH\ LOW}$) range 178 in FIG. 5A receives a test pulse, such as a READ pulse or a SET pulse, the state of the RESET cell may change to a SET state having threshold voltage within a low SET Vth (SET $V_{TH\ LOW}$) range 174. Based on the determination that the state of the memory cell has been altered to a SET state after receiving the test pulse, it can be inferred that the state of the memory cell was a RESET state prior to receiving the test pulse. In some embodiments, after determining what the state of the memory cell was before applying the test pulse, the altered memory cell in the SET $V_{TH\ LOW}$ range 174 can then be refreshed back to its state before having received the test pulse, e.g., such that it has a threshold voltage within RESET $V_{TH\ LOW}$ range 178.

Figure 5B:
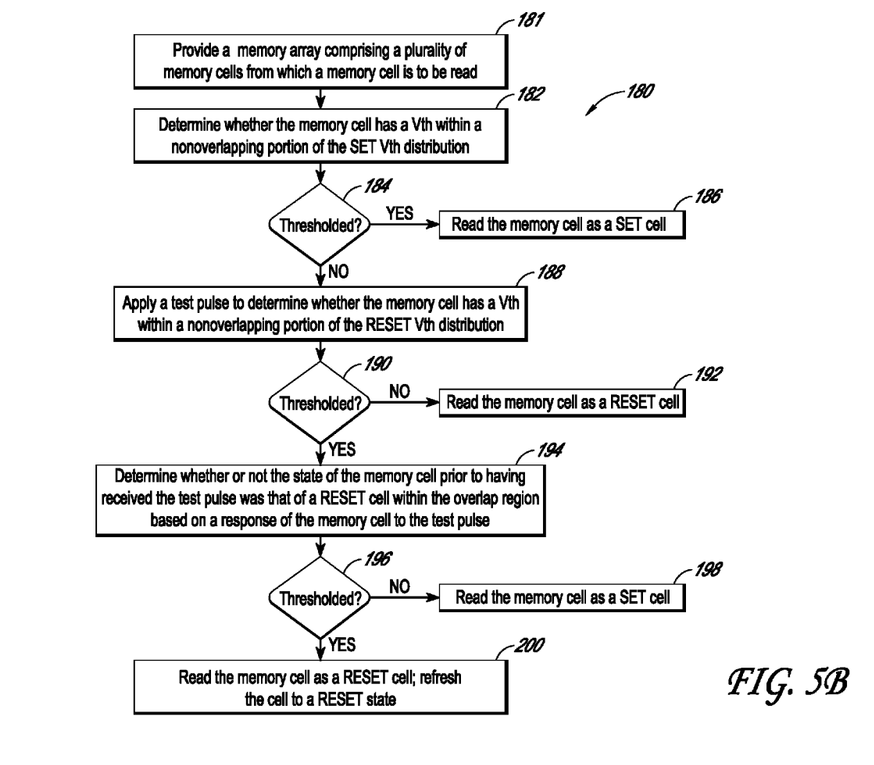
FIG. 5B is a flow chart depicting a method of reading a memory cell according to some embodiments.

FIG. 5B is a flow chart illustrating a method 180 of reading a memory cell in a cross point array having a negative read voltage window as described in FIG. 5A by using a test pulse to alter a RESET cell within the overlap region to a SET cell, and inferring therefrom that the state of the memory cell was a RESET state prior to receiving the test pulse, according to some embodiments. The method 180 comprises providing at block 181 a memory array comprising a plurality of memory cells, from which a memory cell is to be read. The memory cell can be in the SET $V_{TH}$ distribution curve 154 or the RESET $V_{TH}$ distribution curve 158 illustrated in FIG. 5A.

The method 180 additionally comprises determining at block 182 whether the memory cell has a threshold voltage (Vth) within a nonoverlapping portion of the SET $V_{TH}$ distribution curve 154 by, for example, applying a $V_{READ}$=RESET $V_{TH\ MIN}$ 162. At a decision block 184, a determination is made as to whether the memory cell has thresholded or not by, for example, detecting a snapback event and/or a detecting a read current or voltage in the post snap back region of the current-voltage curve as described above in FIG. 2. Upon determination at the decision block 184 that the memory cell has thresholded, the memory is read at a block 186 as having a SET state within the nonoverlapping portion of the SET $V_{TH}$ distribution curve 154 (FIG. 5A), and the method 180 ends. On the other hand, upon determination at the decision block 184 that the memory cell has not thresholded, the memory cell is determined to be outside of the nonoverlapping portion of the SET $V_{TH}$ distribution curve 154, i.e., either in the overlap region 176 of FIG. 5A or in a nonoverlapping portion of the RESET $V_{TH}$ distribution curve 158 of FIG. 5A, and the method 180 continues.

Still referring to both FIGS. 5A and 5B, the method 180 comprises applying a test pulse, e.g., a READ pulse, at a block 188 to determine whether the memory cell has a Vth within a nonoverlapping portion of the RESET $V_{TH}$ distribution curve 158 of FIG. 5A. Since it has been determined at the decision block 184 that the memory cell is outside of the nonoverlapping portion of the SET $V_{TH}$ distribution curve 154, the determination of whether the memory cell has a Vth within the negative RVW 179 can be made by a process of elimination by determining whether the memory cell has a Vth within the nonoverlapping portion of the RESET $V_{TH}$ distribution curve 158. This can be done by, for example, applying a test READ pulse at the block 188 having a voltage $V_{READ}$=SET $V_{TH}$ MAX 166. After application of the test READ pulse, at a decision block 190, a determination is made as to whether the memory cell has thresholded or not. Upon a determination at the decision block 190 that the memory cell has not thresholded, the memory cell is read at a block 192 as having a RESET state within the nonoverlapping portion of the RESET $V_{TH}$ distribution curve 158, and the method 180 ends. On the other hand, upon a determination at the decision block 190 that the memory cell has thresholded, the memory cell is determined to be within the overlap region 176 corresponding to memory cells having the negative RVW 170 of FIG. 5A.

It will be appreciated that in some embodiments, the test pulse comprising the test READ pulse applied at the block 188 can be sufficient to alter the state of the memory cell from a RESET cell having a Vth within the RESET $V_{TH\,LOW}$ range 178 to a SET cell having a Vth within the SET $V_{TH\,LOW}$ range 174. Such may be the case, for example, when the test READ pulse provides sufficient discharge current/energy from a snap back discharge to alter the state of the memory cell, as described above. In some embodiments, a test pulse comprising a single test READ pulse may not be sufficient to alter the state of the memory cell. In embodiments where a test pulse comprising a single test READ pulse may not be sufficient to alter the state of the memory cell, the test pulse may comprise one or more additional pulses. The one or more additional pulses may comprise, for example additional READ pulse(s) applied in addition to the READ pulse applied at the block 188, or a SET pulse applied in addition to the READ pulse applied at the block 188.

Still referring to both FIGS. 5A and 5B, at a block 194, a determination is made as to whether or not the state of the memory cell prior to having received the test pulse was that of a RESET cell within the overlap region 176 having a low Vth within the RESET $V_{TH\,LOW}$ range 178, based on a response of the memory cell to the test pulse received at the block 188. In particular, as described above, it can be inferred that that the state of the memory cell was a RESET state within the RESET $V_{TH\,LOW}$ range 178 prior to receiving the test pulse if it can be determined that the state of the memory cell has been altered to a SET cell within the SET $V_{TH\,LOW}$ range 174 after receiving the test pulse.

Therefore, the method 180 comprises a decision block 196 to determine whether or not the memory cell has thresholded under a read voltage $V_{READ}$=V RESET $V_{TH\,MIN}$ 162. Upon determination at the decision block 196 that the memory cell has not thresholded, the memory cell is determined to not have been a RESET cell having a state within the RESET $V_{TH\,LOW}$ range 178 prior to receiving the test pulse at the block 194, and instead that the memory cell is read as being a SET cell having a threshold voltage within the overlap region 176, and the method 180 ends. On the other hand, upon a determination at the decision block 196 that the memory cell has thresholded, the memory is determined to have been a RESET state within the RESET $V_{TH\,LOW}$ range 178 prior to receiving the test pulse, and the memory cell is read at a block 200 as being a RESET cell. Once this determination has been made, cell that has been read as being a RESET cell which has the altered memory state within the SET $V_{TH\,LOW}$ range 174 can be refreshed such that the memory cell is placed back to RESET $V_{TH\,LOW}$ range 178, which has been inferred to have been its original state.

FIG. 6A is a schematic threshold distribution probability plot 210 illustrating a method of reading a memory cell in a cross point array having a negative read voltage window (i.e., overlapping SET $V_{TH}$ and RESET $V_{TH}$ distributions), according to some other embodiments. The x-axis and the y-axis of the cumulative distribution probability plot 210 represent, respectively, the threshold voltage of memory cells in the memory array and the probability (in percentile) of memory cells in a memory array having a threshold voltage lower than the voltage reported on the x-axis.

The cumulative distribution probability plot 210 includes a SET $V_{TH}$ distributions curve 214 and a RESET $V_{TH}$ distribution curve 218 corresponding to respective distributions $V_{TH\,SET}$ of memory cells in SET states and distributions of $V_{TH\,RESET}$ of memory cells in RESET states. The SET $V_{TH}$ distribution curve 214 has a maximum threshold voltage within the distribution (SET $V_{TH\,MAX}$) 226 and the RESET $V_{TH}$ distribution curve 218 has a minimum threshold voltage within the distribution (RESET $V_{TH\,MIN}$) 232. Similar to the probability plot 150 of FIG. 5A, FIG. 6A has a RVW 230, similarly defined as the difference of the RESET $V_{TH\,MIN}$ 222 and the SET $V_{TH\,MAX}$ 226 as defined herein, that is negative. As a result, similar to FIG. 5A, two memory cells in different resistance states (e.g., SET and RESET states) having similar threshold voltages within the negative RVW 230 may not be distinguishable by using a simple threshold read scheme.

According to some embodiments, the two memory cells within the negative RVW 230 as in FIG. 6A can be distinguished through a method including applying a test pulse to a memory cell within the overlap region 234. According the method, upon determining that the threshold voltage has a value within the negative RVW 230, a test pulse can be applied to the memory cell. In some embodiments, applying the test pulse comprises thresholding the memory cell such that a snap-back discharge current flows through the memory cell. In some embodiments, applying the test pulse comprises applying a RESET pulse, which can include a snap back event. In some embodiments, if the memory cell prior to receiving the test pulse is in a SET state within the negative RVW 234, and applying the test pulse results in altering of the state to a RESET state, it can be inferred that the state of the memory cell that has been altered was in a SET state to begin with. For example, when a SET cell within a high SET Vth (SET $V_{TH\,HIGH}$) range 234 in FIG. 5A receives a test pulse, such as a RESET pulse, the state of the SET cell can be altered to a RESET state at a high RESET Vth (RESET $V_{TH\,HIGH}$) range 238. Based on the determination that the state of the memory cell has been altered to a RESET state after receiving the test pulse, it can be inferred that that the state of the memory cell was in a SET state prior to receiving the test pulse. The altered memory cell in the RESET $V_{TH\,HIGH}$ range 238 can then be refreshed back to SET $V_{TH\,HIGH}$ range 234.

FIG. 6B is a flow chart illustrating a method 250 of reading a memory cell in a memory array having a negative read voltage window as described in FIG. 6A by using a test pulse to alter a SET cell within the overlap region to a RESET cell, and inferring therefrom that the state of the memory cell was a SET state prior to receiving the test pulse, according to some embodiments. Similar to FIG. 5B, the method 250 comprises providing at block 251 a memory array comprising a plurality of memory cells, from which a memory cell is to be read, having the SET $V_{TH}$ distribution curve 214 or the RESET $V_{TH}$ distribution curve 218 illustrated in FIG. 6A.

Also similar to FIG. 5B, and with continued reference to both FIGS. 6A and 6B, the method 250 additionally comprises determining at block 252 whether the memory cell has a threshold voltage (Vth) within a nonoverlapping portion of the SET $V_{TH}$ distribution curve 214 by applying a $V_{READ}$=RESET $V_{TH\ MIN}$ 222, and determining at a decision block 254 as to whether the memory cell has thresholded or not. Upon a determination at the block 254 that the memory cell has thresholded, the memory cell is read at a block 256 as having a SET state, and the method 250 ends. On the other hand, upon determination at the block 254 that the memory cell has not thresholded, the memory cell is determined to be outside of the nonoverlapping portion of the SET $V_{TH}$ distribution curve 214, and the method 250 continues.

Still referring to FIG. 6B, the method 250 comprises applying a READ pulse at block 258 to determine whether the memory cell has a Vth within a nonoverlapping portion of the RESET $V_{TH}$ distribution curve 218 of FIG. 6A. Similar to FIG. 5B, the determination of whether the memory cell has a Vth within the negative RVW 230 can be made by a process of elimination by determining whether the memory cell has a Vth within a nonoverlapping portion of the RESET $V_{TH}$ distribution curve 218, by applying a READ pulse at the block 258 having a voltage $V_{READ}$=SET $V_{TH\ MAX}$ 226. After application of the READ pulse at block 258, at a decision block 260, a determination is made as to whether the memory cell has thresholded or not. Upon determination at the decision block 260 that the memory cell has not thresholded, the memory cell is read at a block 262 as having a RESET state within the nonoverlapping portion of the RESET $V_{TH}$ distribution curve 218, and the method 250 ends. On the other hand, upon determination at the decision block 260 that the memory cell has thresholded, the memory cell is determined to be within the overlap region 216 corresponding to memory cells having the negative RVW 230 of FIG. 6A.

Unlike in FIG. 5B, instead of utilizing a READ pulse applied at the block 258 that may be sufficient to alter the state of the memory cell from a RESET cell having a Vth within a RESET $V_{TH\ LOW}$ range (similar to RESET $V_{TH\ LOW}$ range 178 in FIG. 5B) to infer the cell state prior to receiving the READ pulse, in the method 250 of FIG. 6B, a RESET pulse is utilized to alter the state of a memory cell within the SET $V_{TH\ HIGH}$ range 234 to a state within the RESET $V_{TH\ HIGH}$ range 238. Such an approach may be advantageous, for example, where a current substantially higher than a snap back discharge current is needed to alter the state of a memory cell in a SET state within the overlap region 230 to a RESET state. Therefore, unlike in FIG. 5B, where a READ pulse itself can be a test pulse, in FIG. 6B, a test pulse comprising a RESET pulse is applied at the block 264.

Still referring to FIGS. 6A and 6B, at a block 266, a determination is made as to whether or not the state of the memory cell prior to having received the test pulse was that of a SET cell within the overlap region 216 having a Vth within the SET $V_{TH\ HIGH}$ range 234, or a RESET cell within the overlap region 216 having a Vth within the RESET $V_{TH\ LOW}$ range similar to the RESET $V_{TH\ LOW}$ range 178 in FIG. 5A, based on reading the cell after applying the test pulse comprising a RESET pulse at the block 264. This determination can be made, for example, by applying a read voltage pulse having a $V_{READ}$=SET $V_{TH\ MAX}$ 226 at the block 266.

After applying the read voltage pulse at the block 266, the method 250 continues to a decision block 268 to determine whether or not the memory cell has thresholded in response to the read voltage pulse having $V_{READ}$=SET $V_{TH\ MAX}$ 226. Upon determination at the decision block 268 that the memory cell has not thresholded, the memory cell is determined to have been a SET cell that was in a state within the SET $V_{TH\ HIGH}$ range 234 within the overlap region 216. Once this determination has been made, the memory cell is read as a SET cell at a block 272. In addition, since the memory cell now has the altered memory state that may be within, for e.g., the RESET $V_{TH\ HIGH}$ range 238, the memory cell can be refreshed at the block 272 such that the memory cell is placed back to SET $V_{TH\ HIGH}$ range 234, which has been inferred to have been its original state, and the method 250 ends.

On the other hand, upon determination at the decision block 268 that the memory cell has thresholded, the memory cell is determined to have been a RESET state within the overlap region 216 having a Vth in the RESET $V_{TH\ LOW}$ range similar to the RESET $V_{TH\ LOW}$ range 178 in FIG. 5A, prior to receiving the test pulse at the block 264. Once this determination has been made, the memory cell is read at a block 270 as being a RESET cell within the overlap region 216. In addition, since a memory cell in a RESET cell within the overlap region 216 can be altered by a READ pulse received at the box 266 in a similar manner described above in FIGS. 5A and 5B, the memory cell can be refreshed at the block 270 such that the memory cell is placed back to a RESET $V_{TH\ LOW}$ range similar to the RESET $V_{TH\ LOW}$ range 178 in FIG. 5A, which has been inferred to have been its original state, and the method 250 ends.

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. A method of reading a memory cell in a memory array including a plurality of memory cells, the method comprising:

providing the plurality of memory cells in a plurality of different states;

determining whether a threshold voltage (Vth) of a memory cell of the plurality of memory cells has a value within a predetermined read voltage window in which threshold voltages of at least some of the memory cells in different states overlap;

applying a test pulse to the memory cell having the threshold voltage within the predetermined read voltage window; and determining the state of the memory cell based on a response of the memory cell to the test pulse, wherein the state corresponds to the one of the plurality of states of the memory cell prior to receiving the test pulse.

2. The method of claim 1, wherein applying the test pulse changes a state of the memory cell and further comprising, after determining the state of the memory cell, refreshing the memory cell to the state of the memory cell prior to receiving the test pulse.

3. The method of claim 1, wherein applying the test pulse comprises thresholding the memory cell such that a snapback discharge current flows through the memory cell.

4. The method of claim 1, wherein the memory cell comprises a phase change memory cell having at least one of a storage node or a selector node comprising a chalcogenide material.

5. The method of claim 4, wherein one of the plurality of states corresponds to a SET state and the other of the plurality of states corresponds to a RESET state.

6. The method of claim 5, wherein applying the test pulse comprises applying one of a READ pulse or a SET pulse.

7. The method of claim 6, wherein the memory cell prior to receiving the test pulse is in a RESET state, and wherein applying the test pulse comprises applying a bit-altering test pulse such that the state of the memory cell is changed to a SET state.

8. The method of claim 7, wherein determining the state of the memory cell comprises determining that the state of the memory cell was a RESET state prior to receiving the test pulse based on a determination that the state of the memory cell is in a SET state after applying the test pulse.

9. The method of claim 5, wherein applying the test pulse comprises applying a RESET pulse.

10. The method of claim 9, wherein the memory cell prior to receiving the test pulse is in a SET state, and wherein applying the test pulse comprises applying a bit-altering test pulse such that the state of the memory cell is changed to a RESET state.

11. The method of claim 10, wherein determining the state of the memory cell comprises determining that the state of the memory cell was a SET state prior to receiving the test pulse based on a determination that the state of the memory cell is in a RESET state after applying the test pulse.

12. The method of claim 1, wherein providing the memory array comprises providing a plurality of memory cells, further comprising:
applying at least one of a SET pulse or a RESET pulse to each memory cell of the memory array such that the memory array has a SET distribution comprising memory cells that have received SET pulses and has a RESET distribution comprising memory cells that have received RESET pulses.

13. The method of claim 12, wherein a lowest Vth of the RESET distribution has a Vth value lower than a highest Vth of the SET distribution such that the predetermined read voltage window has a negative value.

14. The method of claim 1, wherein upon determining that the threshold voltage (Vth) of the memory cell has a value within the predetermined read voltage window, applying an error correction code instead of or in addition to proceeding to apply the test pulse.

15. An apparatus comprising:
an array of a plurality of memory cells in a plurality of different states; and
a memory controller configured to:
determine whether a threshold voltage (Vth) of a memory cell of the plurality of memory cells has a value within a predetermined read voltage window in which threshold voltages of at least some of the memory cells in different states overlap;
cause a test pulse to be applied to the memory cell upon determining that the threshold voltage has a value within the predetermined read voltage window; and
determine the state of the memory cell prior to receiving the test pulse based on a response of the memory cell to the test pulse.

16. The apparatus of claim 15, wherein the memory controller is further configured to, after determining the state of the memory cell, refresh the memory cell to the state prior to receiving the test pulse.

17. The apparatus of claim 15, wherein causing the test pulse to be applied comprises causing the memory cell to be thresholded such that a snap-back discharge current flows through the memory cell.

18. The apparatus of claim 15, wherein the memory cell comprises a phase change memory cell having at least one of a storage node or a selector node comprising a chalcogenide material.

19. The memory cell of claim 18, wherein one of the first and second states corresponds to a SET state and the other of the first and second states corresponds to a RESET state.

20. The apparatus of claim 15, wherein causing the test pulse to be applied comprises causing one of a bit-altering READ pulse or a bit-altering SET pulse to be applied.

21. The apparatus of claim 20, wherein the memory controller is configured to determine that the state of the memory cell was a RESET state prior to receiving the test pulse based on a determination that the state of the memory cell is in a SET state after applying the test pulse.

22. The apparatus of claim 21, wherein the memory controller is configured to determine that the state of the memory cell was a SET state prior to receiving the test pulse based on a determination that the state of the memory cell is in a RESET state after applying the test pulse.

23. The apparatus of claim 15, wherein the memory array comprises a cross point array, wherein the memory cell is disposed at an intersection between a column and a row.

* * * * *